(12) United States Patent
Osada

(10) Patent No.: US 6,822,697 B1
(45) Date of Patent: Nov. 23, 2004

(54) TELEVISION TUNER THAT GENERATES NO INTERFERING SIGNAL

(75) Inventor: Shigeru Osada, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 802 days.

(21) Appl. No.: 09/627,337

(22) Filed: Jul. 28, 2000

(30) Foreign Application Priority Data

Jul. 29, 1999 (JP) .......................................... 11-214906

(51) Int. Cl.[7] .............................................. H04N 5/50
(52) U.S. Cl. ...................... 348/731; 348/732; 348/733; 455/191.1; 334/47
(58) Field of Search .................................. 348/731, 732, 348/733, 725, 723, 729, 607, 21; 455/191.1, 191.3, 193.3, 188.1, 179.1, 180.1, 180.3, 180.4; 334/15, 65, 47, 1

(56) References Cited

U.S. PATENT DOCUMENTS

| | | | | |
|---|---|---|---|---|
| 4,571,560 A | * | 2/1986 | Dobrovolny | ................ 333/174 |
| 4,823,099 A | * | 4/1989 | Leipert | ......................... 334/15 |
| 4,907,292 A | * | 3/1990 | Leipert | ........................ 455/280 |
| 5,574,997 A | * | 11/1996 | Hong | ....................... 455/180.1 |
| 5,963,842 A | * | 10/1999 | Kinugawa | .................... 725/68 |
| 6,014,547 A | * | 1/2000 | Caporizzo et al. | ........... 725/151 |
| 6,016,170 A | * | 1/2000 | Takayama et al. | ............ 348/731 |
| 6,094,236 A | * | 7/2000 | Abe et al. | ..................... 348/731 |
| 6,108,050 A | * | 8/2000 | Yamamoto et al. | .......... 348/731 |
| 6,404,349 B1 | * | 6/2002 | Kaminosono | ........... 340/825.49 |

FOREIGN PATENT DOCUMENTS

| | | | | |
|---|---|---|---|---|
| EP | 0 929 146 A1 | * | 7/1999 | ............. H03D/7/16 |
| JP | 7-38384 | | 2/1995 | |

* cited by examiner

Primary Examiner—John Miller
Assistant Examiner—Jean W. Désir
(74) Attorney, Agent, or Firm—Brinks Hofer Gilson & Lione

(57) ABSTRACT

Needless signal that causes interference is prevented from entering to eliminate the generation of interfering signal. A television tuner is provided with a band switching circuit to which television signals of a plurality of channels arranged in a predetermined frequency band are supplied, the band switching circuit has a plurality of filters having the cutoff frequency of every one octave frequency in the predetermined frequency band, the cutoff frequency of the plurality of filters is made continuous every one octave in the predetermined frequency band, and the television signal of the channel to be received is sent out through a specified filter having the cutoff frequency within one octave from the frequency of the television signal of the channel to be received.

11 Claims, 3 Drawing Sheets

| SELECTION BAND | BAND SWITCHING CONTROL CIRCUIT OUTPUT | | | |
| --- | --- | --- | --- | --- |
| | 18a | 18b | 18c | 18d |
| FIRST BAND | H | L | L | L |
| SECOND BAND | L | H | L | L |
| THIRD BAND | L | L | H | L |
| FOURTH BAND | L | L | L | H |

TELEVISION TUNER THAT GENERATES NO INTERFERING SIGNAL

BACKGROUND OF THE INVENTION

1. Field of the Invention

This invention relates to a television tuner to which television signals of a plurality of channels arranged in a predetermined frequency band are supplied, and more particularly relates to a television tuner that performs frequency conversion twice.

2. Description of the Related Art

The structure of a television tuner is shown in FIG. 5. Television signals of a plurality of channels arranged in a band, for example, from 50 MHz to 800 MHz are supplied to a band pass filter 41, and needless signals outside the band are removed. The pass band of the band filter 41 is the same band from 50 MHz to 800 MHz as the band in which the television channels are arranged. The television signal that pass the band pass filter 41 is amplified by means of a high frequency amplifier 42, and the television signal of a receiving channel is frequency-converted to the first intermediate frequency signal of approximately 1300 MHz by means of the first mixer 43. A local oscillation signal to be served for frequency conversion is supplied from a first local oscillator 44 to the first mixer 43. A first PLL circuit 45 controls the oscillation frequency of the first local oscillator 44.

The first intermediate frequency filter 46 having the pass band of approximately 6 MHz removes needless signals from the first intermediate frequency signal, and then a second mixer 47 frequency-converts it to the second intermediate frequency signal of approximately 45 MHz. A second local oscillator 48 supplies the local oscillation signal to be served for frequency conversion to the second mixer 47, and a PLL circuit 49 controls the oscillation frequency of the second local oscillator 48. The second intermediate frequency signal passes a second intermediate frequency filter 50 and is amplified by means of a second intermediate frequency amplifier 51, and then supplied to an intermediate frequency circuit not shown in the drawing.

In the case of a conventional television tuner, because television signals of all channels are supplied to the high frequency amplifier 42, the high frequency amplifier 42 generates many strained signals, and these strained signals interfere with the television signal of the receiving channel, which is a problem.

For example, when the television signal of another channel having a ½ frequency of the television signal of a receiving channel is supplied to the high frequency amplifier 42, the double higher harmonic wave of the television signal of another channel is generated to with the television signal of the receiving channel because both frequencies are identical.

When the television signal of a different channel having a frequency to be doubled is supplied, the high frequency amplifier 42 generates a signal having a frequency that is the difference between the frequency of the television signal of the different channel and the frequency of the television-signal of the receiving channel, the frequency of the signal of the difference is identical with the frequency of the television signal of the receiving channel, and the signal interferes the television signal of the receiving channel. Needless signals such as higher harmonic waves and difference signals are generated also from the first mixer in the same, mechanism as involved in the high frequency amplifier 42.

It is the object of the present invention to prevent the needless signal that causes interfere as described hereinabove from being supplied, and to eliminate the generation of interfering signal.

SUMMARY OF THE INVENTION

To solve the above-mentioned problem, a television tuner of the present invention is characterized in that the television tuner is provided with a band switching circuit to which television signals of a plurality of channels arranged in a predetermined frequency band, the band switching circuit has a plurality of filters having the cutoff frequency of every one octave frequency in the predetermined frequency band, the cutoff frequency of the plurality of filters is made continuous every one octave in the predetermined frequency band, and the television signal of the channel to be received is sent out through the specified filter having the cutoff frequency within one octave from the frequency of the television signal of the channel to be received.

The television tuner is characterized in that the cutoff frequency can be changed by one octave.

The television tuner is further characterized in that the plurality of filters are provided with varactor diodes that constitute the filters, and a voltage is applied on the varactor diodes to vary the voltage.

The television tuner is further characterized in that input side switching diodes are connected respectively to respective input terminals of the plurality of filters and output side switching diodes are connected respectively to respective output terminals of the plurality of filters, a voltage is applied on the input side switching diode and the output side diode that are connected to the specified filter and the input side switching diode and the output side diode are made conductive.

The television tuner is characterized in that the television tuner is provided with a voltage dividing circuit having two voltage input terminals for generating a divided voltage that is different depending on the voltage applied on any one of the two voltage input terminals and provided with a band switching control circuit having a plurality of voltage output terminals for applying a switching voltage on at least one of the voltage output terminals corresponding to the channel to be received, the switching voltage applied on the voltage output terminals is applied on the input side switching diodes, the output side diodes connected to the plurality of filters, and the two voltage input terminals of the voltage dividing circuit, and the divided voltage is applied on the varactor diodes.

The television tuner is further characterized in that the plurality of filters are connected with high pass filters or low pass filters.

The television tuner is characterized in that the plurality of filters are constituted with band pass filters.

DETAILED DESCRIPTION OF THE PREFERRED EMBODIMENTS

Figure 1:
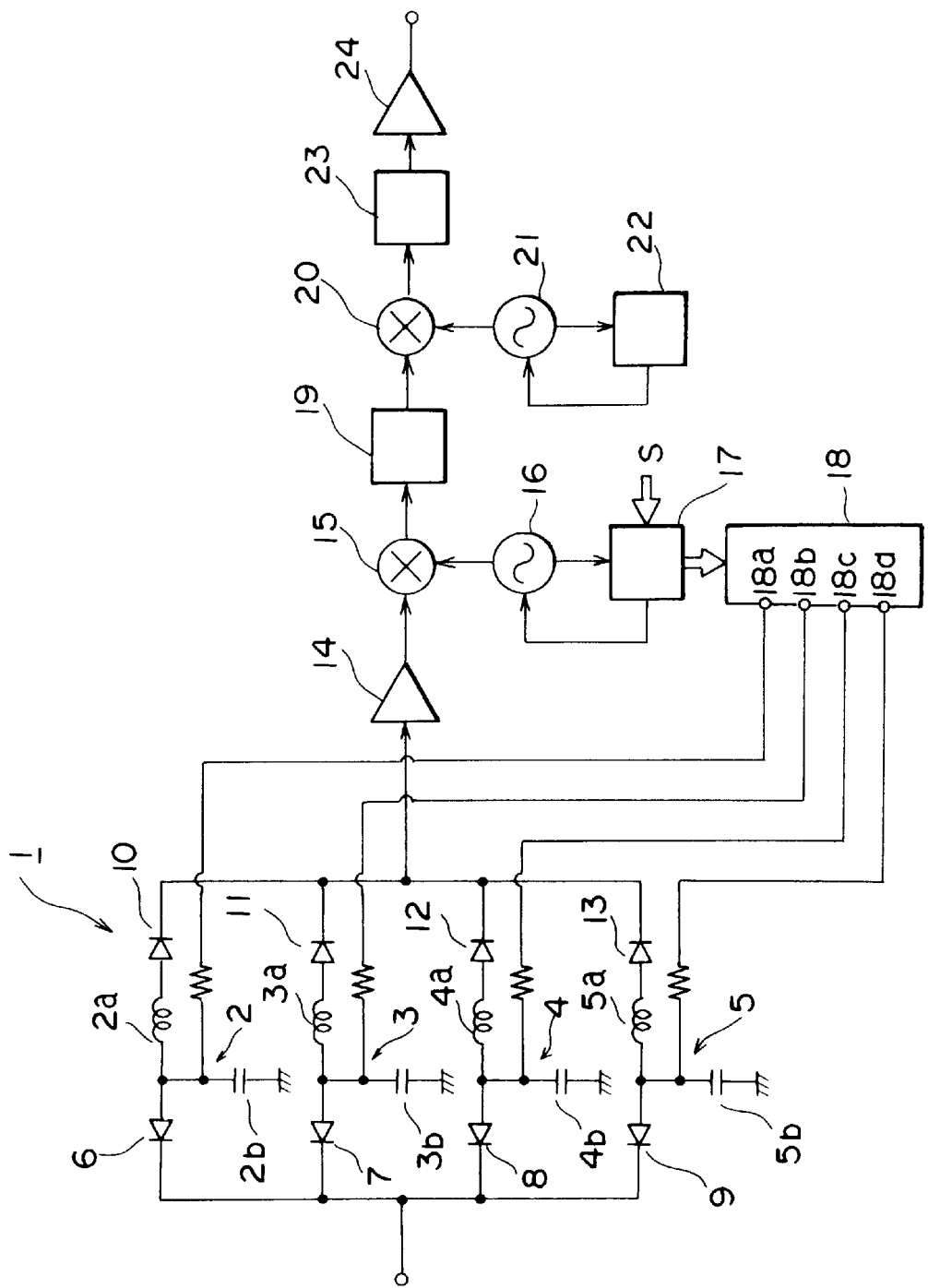
FIG. 1 is a structural diagram illustrating the first embodiment of a television tuner of the present invention.
Figures 2, 3:
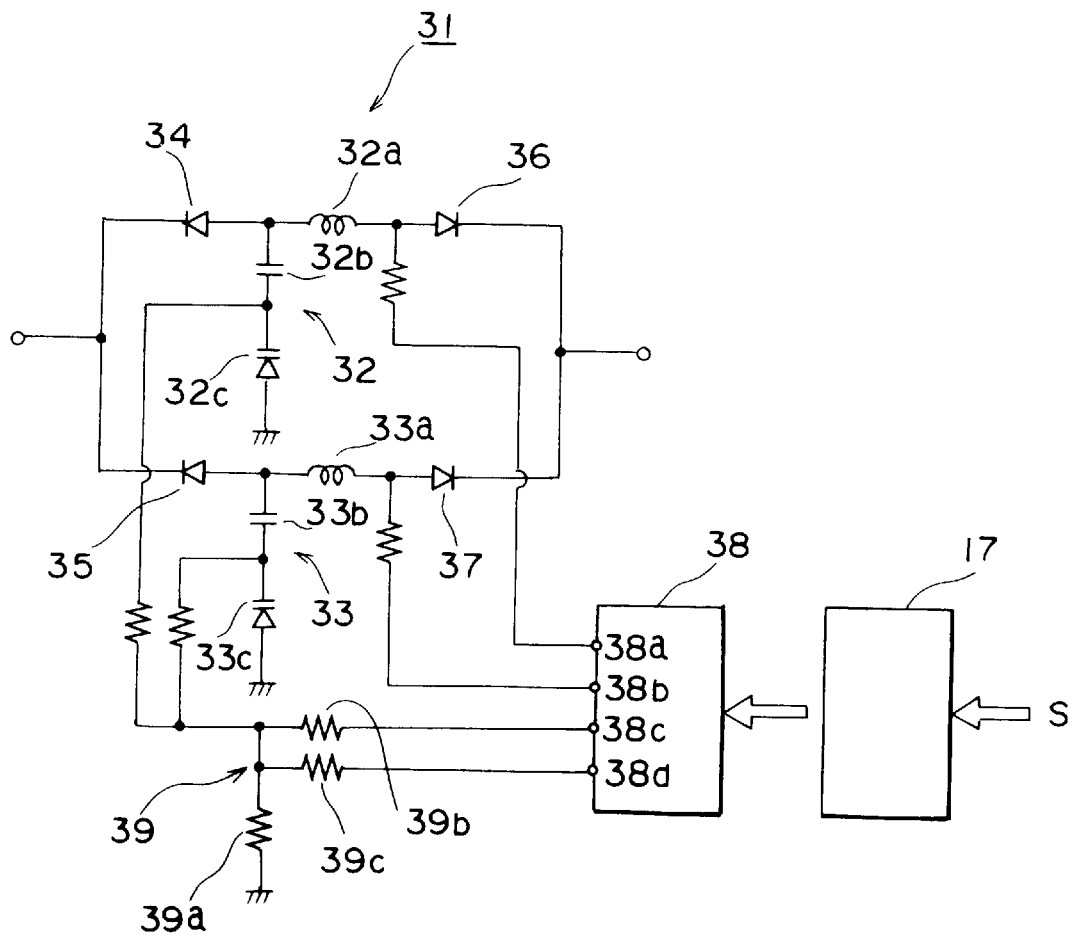
FIG. 2 is a switching voltage state diagram describing the band switching operation in the first embodiment of the television tuner of the present invention.
FIG. 3 is a structural diagram illustrating the second embodiment of a television tuner of the present invention.

The first embodiment of a television tuner of the present invention will be described in detail hereinafter with reference to FIG. 1 and FIG. 2. FIG. 1 is a structural diagram, and FIG. 2 is a switch voltage state diagram for describing the band switching operation. In FIG. 1, for example, television signals of a plurality of channels arranged in a band from 50 MHz to 800 MHz are supplied to a band switching circuit 1. The band switching circuit 1 is provided with a plurality of filters, for example, four low pass filters 2, 3, 4, and 5, and the respective low pass filters comprise series inductors 2a, 3a, 4a, and 5a and shunt capacitors 2b, 3b, 4b, and 5b. The cutoff frequency of these high pass filters 2 to 5 is different every one octave, the cutoff frequency of the first high pass filter 2 is 100 MHz, that of the second high pass filter 3 is 200 MHz, that of the third high pass filter 4 is 400 MHz, and the fourth high pass filter 5 is 800 MHz.

Respective input terminals of the low pass filters 2 to 5 are connected to respective anodes of input side switching diodes 6, 7, 8, and 9, and the respective output terminals of the low pass filters 2 to 5 are connected to respective anodes of output side switching diodes 10, 11, 12, and 13. The television signal is supplied commonly to the cathodes of the input side switching diodes 2 to 5, and the cathodes of the output side switching diodes 10 to 13 are connected commonly to a high frequency amplifier 14. The television signal of a receiving channel is supplied to the high frequency amplifier 14 through any one of the low pass filters.

The television signal amplified by means of the high frequency amplifier 14 is frequency-converted to the first intermediate frequency signal of approximately 1300 MHz by means of a first mixer 15. A first local oscillator 16 supplies the local oscillation signal used for frequency conversion to the first mixer 15. A first PLL circuit 17 controls the oscillation frequency of the first local oscillator 16.

A channel selector not shown in the drawing of a television receiver supplies the channel selection signal (S) to the first PLL circuit 17. The oscillation frequency of the first local oscillator 16 is determined based on the channel selection signal. The channel selection signal is supplied to a band switching control circuit 18 by way of the PLL circuit 17, and the band switching control circuit 18 generates a switching voltage used for selecting one specified filter in the band switching circuit 1 based on the input channel selection signal and supplies it to the band switching circuit 1.

The band switching control circuit 18 is provided with the first to fourth voltage output terminals 18a, 18b, 18c, and 18d. The first voltage output terminal 18a to the fourth voltage output terminal 18d are DC-connected to the input side switching diodes 6 to 9 and the output side switching diodes 10 to 13 connected to the first low pass filter 2 to the fourth low pass filter 5.

The switching voltage is supplied to the first voltage output terminal 18a to fourth voltage output terminal 18d depending on the band of the receiving channel as shown in FIG. 2. In detail, the above-mentioned band is divided into four for convenience, for example, the first band ranges from 50 MHz to 100 MHz, the second band ranges from 100 MHz to 200 MHz, the third band ranges from 200 MHz to 400 MHz, and the fourth band ranges from 400 MHz to 800 MHz. In that case, when the television signal of the first band is received, the switching voltage having a high voltage level (H) is supplied only to the first voltage output terminal 18a. Similarly, the high level switching voltage is supplied only to the second voltage output terminal 18b for the second band, only to the third voltage output terminal 18c for the third band, and only to the fourth voltage output terminal 18d for the fourth band.

The switching control of the band switching circuit 1 by means of the band switching circuit 18 will be described herein under.

The frequency of the television signal of the receiving channel is assumed to be 250 MHz. The band of the receiving channel corresponds to the third band, a high level voltage is supplied to the third voltage output terminal 18c as shown in FIG. 2, and a low level voltage of, for example, 0 volt is supplied to other voltage output terminals. As the result, the input side switching diode 8 and the output side switching diode 12, which are connected to the third low pass filter 4, become conductive, and other diodes are not conductive. As the result, the television signal having the frequency of 400 or lower is allowed to pass through the specified third low pass filter 4 of the band switching circuit 1 and amplified by means of the high frequency amplifier 14. In this range, the television signal of the receiving channel is included, and other television signals having double frequency (500 MHz) do not pass because the cutoff frequency of the third low pass filter 4 is within one octave from the frequency of the television signal of the receiving channel (250 MHz).

The needless signal included in the first intermediate frequency signal sent out form the first mixer 15 is removed by means of the first intermediate frequency filter 19 having the pass band of approximately 6 MHz, and the first intermediate frequency signal is frequency-converted to the second intermediate frequency signal of approximately 45 MHz by means of the second mixer 20. The second oscillation signal used for frequency conversion is supplied from the second local oscillator 21 to the second mixer 20, and the second PLL circuit 22 controls the oscillation frequency of the second local oscillator 21. The second intermediate frequency signal passes through the second intermediate frequency filter 23 and amplified by means of the second intermediate frequency amplifier 24, and then supplied to an intermediate frequency circuit not shown in the drawing.

Because other television signals having the frequency of one octave higher than the frequency of the television signal of the receiving channel are not allowed to pass through any low pass filter by means of the function of the band switching circuit 1 as described hereinabove, the television signal of the receiving channel will not be interfered by other television signals. To eliminate the interference by the television signal having the frequency one octave lower than the frequency of the television signal of the receiving channel, all the low pass filters 2 to 5 described hereinabove may be replaced with high pass filters. On the other hand, to eliminate the interference both by the television signal having the frequency one octave higher and by the television signal having the frequency one octave lower, all the low pass filters 2 to 5 may be replaced with band pass filters.

Figures 4, 5:
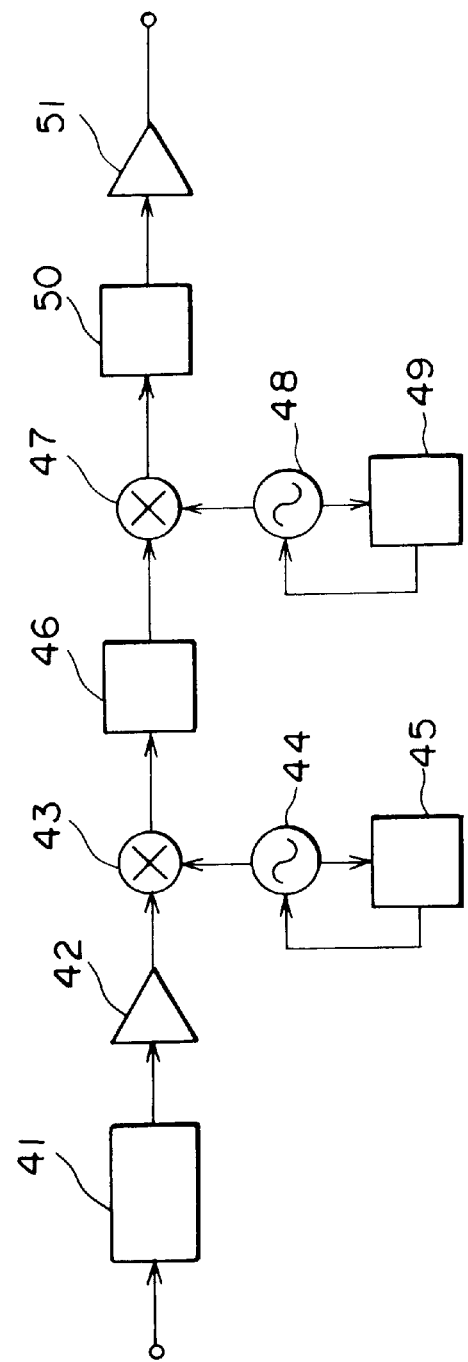
FIG. 4 is a switching voltage state diagram describing the band switching operation in the second embodiment of the television tuner of the present invention.
FIG. 5 is a structural diagram of a conventional television tuner.

Next, the second embodiment of the television tuner of the present invention will be described herein under with reference to FIG. 3 and FIG. 4. FIG. 3 is a structural diagram and FIG. 4 is a switching voltage state diagram for describing the band switching operation. In FIG. 3, a band switching circuit 31 is the alternative to the band switching circuit 1 in FIG. 1, and a band switching control circuit 38 is the alternative to the band switching control circuit 18 in FIG. 1.

The band-switching circuit 31 is provided with the first low pass filter 32 and the second low pass filter 33. The first low pass filter 32 comprises a series inductor 32a, a capacitor 32b, and a varactor diode 32c, the capacitor 32b. The varactor diode 32c are connected in series, and the anode of the varactor diode 32c is connected to the ground to form a shunt capacitor. On the other hand, the second high pass filter 33 comprises a series inductor 33a, a capacitor 33b, and a varactor diode 33c. The capacitor 33b and the varactor diode 33c are connected in series, and the anode of the varactor diode 33c is connected to the ground to form a shunt capacitor.

Constants of respective series inductors 32a and 33a and capacitors 32b and 33b are set so that the cutoff frequency of the second low pass filter 33 is approximately double the cutoff frequency of the first low pass filter 32 though it depends on the capacitance of the varactor diodes 32c and 33c.

Furthermore, the respective anodes of input side switching diodes 34 and 35 are connected to the respective input terminals of the low pass filters 32 and 33, and the respective anodes of output side diodes 36 and 37 are connected to the respective output terminals of the low pass filters 32 and 33. The television signal is supplied commonly to the cathodes of the input side switching diodes 34 and 35, and the cathodes of the output side switching diodes 36 and 37 are connected to a high frequency amplifier 2.

The band switching circuit 31 is provided with a voltage dividing circuit 39 for applying a voltage on the varactor diodes 32c and 33c. The voltage dividing circuit 39 has three resistors 39a, 39b, and 39c having the one ends connected each other and the other end of one resistor 39a is grounded. These contact points are connected to cathodes of two varactor diodes 32c and 33c. The other ends of two resistors 39b and 39c are served as voltage input terminals, wherein the resistance value of the resistor 39b is larger than the resistance value of the resistor 39c.

The band switching control circuit 38 has first to fourth voltage output terminals 38a, 38b, 38c, and 38d. The switching voltage is supplied to these voltage output terminals 38a to 38d depending on the band of the receiving channel as shown in FIG. 4. In detail, in the same way as in the first embodiment, the above-mentioned frequency band is divided into four for convenience, for example, the first band ranges from 50 MHz to 100 MHz, the second band ranges from 100 MHz to 200 MHz, the third band ranges from 200 MHz to 400 MHz, and the fourth band ranges from 400 MHz to 800 MHz. In that case, when the television signal of the first band is received, the switching voltage having a high voltage level (H) is supplied only to the first voltage output terminal 38a and the third voltage output terminal 38c. Similarly, the high level switching voltage is supplied to the first voltage output terminal 38a and the fourth voltage output terminal 38d for the second band, to the second voltage output terminal 38b and third voltage output terminal 38c for the third band, and to the second voltage output terminal 38b and the fourth voltage output terminal 38d for the fourth band. The low level switching voltage is supplied to all the other voltage output terminals.

The first voltage output terminal 38a and the second voltage output terminal 38b are DC-connected respectively to the input side switching diode 34 and the output side switching diode 36 that are connected to the first low pass filter 32, and to the input side switching diode 35 and output side switching diode 37 that are connected to the second low pass filter 33. Furthermore, the third voltage output terminal 38c is connected to the other end of the resistor 39b of the voltage dividing circuit 39, and the fourth voltage output terminal 38d is connected to the other end of the resistor 39c of the voltage dividing circuit 39.

For example, if the frequency of the television signal of the receiving channel is 250 MHz, then it corresponds to the third band, and the high level switching voltage is supplied to the second voltage output terminal 38b and the third voltage output terminal 38c of the band switching circuit 38. Thereby, the input side switching diode 35 and the output side switching diode 37 that are connected to the specified second low pass filter become conductive. The switching voltage generated from the third voltage output terminal 38c is divided by means of two resistors 39b and 39a of the voltage dividing circuit 39, and the divided voltage is applied to the varactor diode 33c of the second low pass filter 33. At that time, the second low pass filter 33 has the first cutoff frequency. The cutoff frequency is determined based on the constant of the series inductor 32a and capacitor 33b and the resistance value of the resistors 39b and 39a that set the divided voltage applied on the varactor diode 33c.

Next, if the receiving channel is changed and the frequency of the television signal is changed to 450 MHz concomitantly, the 450 MHz corresponds to the fourth band, then the switching voltage is supplied to the second voltage output terminal 38b and the fourth voltage output terminal 38d of the band switch control circuit 38. At that time the switching voltage is applied on the resistor 39c of the voltage dividing circuit 39. Because the resistance value of the resistance 39c is smaller than that of the resistor 39b, the divided voltage is higher than that of the former, the capacitance value of the varactor diode is smaller, and the second high pass filter 33 has the second cutoff frequency higher than the first cutoff frequency. The second cutoff frequency is also determined based on the constant of the series inductor 33a and the capacitor 33b, and the resistance value of the resistors 39b and 39a that set the divided voltage applied on the varactor diode 33c.

Herein, the constant of the series inductor 33a and the capacitor 33b and the resistance value of the resistors 39a and 39b are determined so that the first cutoff frequency is 400 MHz and the second cutoff frequency is 800 MHz.

When the receiving channel corresponds to the third band and fourth band, because the input side switching diode 35 and the output side switching diode 37 that are connected to the second low pass filter 33 become conductive, the television signal is allowed to pass the second low pass filter. Because the cutoff frequency is switched between 400 MHz and 800 MHz depending on the channel band at that time, the cutoff frequency is within one octave with respect to the frequency of the receiving television signal in any case.

Similarly, if the television frequency of the receiving channel corresponds to, for example, the first band or second band of 200 MHz or lower, because the input side switching diode 34 and the output side switching diode 36 that are connected to the first lowpass filter 32 become conductive, the television signal is allowed to pass the first low pass filter 32. The constant of the series inductor 32a and the capacitor 32b and the resistance value of the resistors 39b and 39a for setting the divided voltage applied on the varactor diode 32c can be set so that the cutoff frequency is switched between 100 MHz and 200 MHz.

In this case also, the cutoff frequency is within one octave with respect to the frequency of the receiving television signal.

Because the cutoff frequency of one low pass filter can be changed by one octave in the second embodiment as described hereinabove, all television signals in the predetermined band can be received even though the number of filters is reduced.

In the second embodiment also, the above-mentioned low pass filter may be replaced with a high pass filter or band pass filter.

A television tuner of the present invention is characterized in that the television tuner is provided with a band switching circuit to which television signals of a plurality of channels arranged in a predetermined frequency band, the band switching circuit has a plurality of filters having the cutoff frequency of every one octave frequency in the predetermined frequency band, the cutoff frequency of the plurality of filters is made continuous every one octave in the predetermined frequency band, and the television signal of the channel to be received is sent out through the specified filter having the cutoff frequency within one octave from the frequency of the television signal of the channel to be received. Therefore, other television signal having the double or halt frequency with respect to the television signal of the channel to be received will not be sent out, and generation of the needless signal that causes interference in an amplifier or the like connected to the subsequent stage is prevented.

The television tuner is characterized in that the cutoff frequency can be changed by one octave. Therefore, one filter can function as two filters that are different in cutoff frequency by one octave each other. As the result, the number of filters can be reduced.

The television tuner is characterized in that the plurality of filters are provided with varactor diodes that constitute the filters, and a voltage is applied on the varactor diodes to vary the voltage. Therefore, the cutoff frequency can be changed easily.

The television tuner is characterized in that input side switching diodes are connected respectively to respective input terminals of the plurality of filters and output side switching diodes are connected respectively to respective output terminals of the plurality of filters, a voltage is applied on the input side switching diode and the output side diode that are connected to the specified filter and the input side switching diode and the output side diode are made conductive. Therefore, the specified filter can be selected easily.

The television tuner is characterized in that the television tuner is provided with a voltage dividing circuit having two voltage input terminals for generating a divided voltage that is different depending on the voltage applied on any one of the two voltage input terminals and provided with a band switching control circuit having a plurality of voltage output terminals for applying a switching voltage on at least one of the voltage output terminals corresponding to the channel to be received, the switching voltage applied on the voltage output terminals is applied on the input side switching diodes, the output side diodes connected to the plurality of filters and the two voltage input terminals of the voltage dividing circuit, and the divided voltage is applied on the varactor diodes. Therefore, the cutoff frequency of the selected specified filter can be changed.

The television tuner is characterized in that the plurality of filters are constituted with high pass filters or low pass filters. Therefore, generation of the needless signal caused by other television signal having a half frequency with respect to the television signal of the channel to be received or the needless signal caused by other television signal having double frequency with respect to the television signal of the channel to be received is prevented by means of a simple structure.

The television tuner is characterized in that the plurality of filters are constituted with band pass filters. Therefore, generation of the needless signal caused by other television signal having a half frequency with respect to the television signal of the channel to be received and the needless signal caused by other television signal having double frequency with respect to the television signal of the channel to be received is prevented.

What is claimed is:

1. A television tuner comprising a band switching circuit to which television signals of a plurality of channels arranged in a predetermined frequency band, the band switching circuit has a plurality of filters having a cutoff frequency of every one octave frequency in the predetermined frequency band, the cutoff frequency of the plurality of filters is made continuous every one octave in the predetermined frequency band, and the television signal of the channel to be received is sent out through a specified filter having the cutoff frequency within one octave from the frequency of the television signal of the channel to be received.

2. The television tuner according to claim 1 wherein the cutoff frequency can be changed by one octave.

3. The television tuner according to claim 2 wherein the plurality of filters are provided with varactor diodes that comprise the filters, a voltage is applied to the varactor diodes to vary bandwidths of the filter.

4. The television tuner according to claim 1 wherein input side switching diodes are connected to respective input terminals of the plurality of filters and output side switching diodes are connected to respective output terminals of the plurality of filters, a voltage is applied to the input side switching diode and to the output side diode that are connected to the specified filter which makes the input side switching diode and the output side diode conductive.

5. The television tuner according to claim 2 further comprising switching diodes, wherein the input side of the switching diodes are connected to respective input terminals of the plurality of filters and output side switching diodes are connected to respective output terminals of the plurality of filters, a voltage is applied to the input side switching diode and to the output side diode that are connected to the specified filter which makes the input side switching diode and the output side diode conductive.

6. The television tuner according to claim 3 wherein input side switching diodes are connected to respective input terminals of the plurality of filters and output side switching diodes are connected respectively to respective output terminals of the plurality of filters, a voltage is applied to the input side switching diode and to the output side diode that are connected to the specified filter which makes the input side switching diode and the output side diode conductive.

7. The television tuner according to claim 6 characterized in that the television tuner is provided with a voltage dividing circuit having two voltage input terminals for generating a divided voltage that is different depending on the voltage applied on any one of the two voltage input terminals and is provided with a band switching control circuit having a plurality of voltage output terminals for applying a switching voltage on at least one of the voltage output terminals corresponding to the channel to be received, the switching voltage applied on the voltage output terminals is applied on the input side switching diodes, the output side diodes connected to the plurality of filters and the two voltage input terminals of the voltage dividing circuit, and the divided voltage is applied on the varactor diodes.

8. The television tuner according to claim 1 wherein the plurality of filters are comprised of high pass filters or low pass filters.

9. The television tuner according to claim 2 wherein the plurality of filters are comprised of high pass filters or low pass filters.

10. The television tuner according to claim 1 wherein the plurality of filters are comprised of band pass filters.

11. The television tuner according to claim 2 wherein the plurality of filters are comprised of band pass filters.

* * * * *